(12) United States Patent
Li et al.

(10) Patent No.: US 11,106,139 B2
(45) Date of Patent: Aug. 31, 2021

(54) OPTICAL PATH COMPENSATION DEVICE

(71) Applicant: SHANGHAI MICRO ELECTRONICS EQUIPMENT (GROUP) CO., LTD., Shanghai (CN)

(72) Inventors: Shurong Li, Shanghai (CN); Hailin Cheng, Shanghai (CN)

(73) Assignee: SHANGHAI MICRO ELECTRONICS EQUIPMENT (GROUP) CO., LTD., Shanghai (CN)

( * ) Notice: Subject to any disclaimer, the term of this patent is extended or adjusted under 35 U.S.C. 154(b) by 33 days.

(21) Appl. No.: 16/627,698

(22) PCT Filed: Jun. 26, 2018

(86) PCT No.: PCT/CN2018/092818
§ 371 (c)(1),
(2) Date: Dec. 30, 2019

(87) PCT Pub. No.: WO2019/001412
PCT Pub. Date: Jan. 3, 2019

(65) Prior Publication Data
US 2020/0166849 A1 May 28, 2020

(30) Foreign Application Priority Data
Jun. 29, 2017 (CN) .......................... 201710516788.5

(51) Int. Cl.
*G03F 7/20* (2006.01)
*G02B 26/08* (2006.01)

(52) U.S. Cl.
CPC ..... *G03F 7/70191* (2013.01); *G02B 26/0875* (2013.01)

(58) Field of Classification Search
CPC . G03F 7/70125; G03F 7/70191; G02B 26/00; G02B 26/0875
(Continued)

(56) References Cited

U.S. PATENT DOCUMENTS 4,824,205 A * 4/1989 Yamashita ......... G02B 23/2407
385/104
6,052,223 A 4/2000 Yoneyama et al.
(Continued)

FOREIGN PATENT DOCUMENTS

CN 2606367 Y 3/2004
CN 102914870 A 2/2013
(Continued)

*Primary Examiner* — Hung Nguyen
(74) *Attorney, Agent, or Firm* — Muncy, Geissler, Olds & Lowe, P.C.

(57) ABSTRACT

An optical path compensation apparatus includes a wedge assembly, a driving mechanism and a preload unit. The wedge assembly includes a movable wedge and a fixed wedge. The movable wedge and the fixed wedge having equal wedge angles and respective wedge surfaces inclined in opposite directions. The preload unit is configured to elastically press the movable wedge on the fixed wedge, and the driving mechanism is configured to cause relative movement between the wedge surface of the movable wedge and the wedge surface of the fixed wedge. This optical path compensation apparatus is capable of achieving effective position correction of a focal plane of a measurement system for focusing and leveling in a smooth, convenient and precise way while not causing any error in other directions.

12 Claims, 9 Drawing Sheets

(58) Field of Classification Search
USPC ..................................................... 355/67–71
See application file for complete search history.

(56) References Cited

U.S. PATENT DOCUMENTS

| | | | |
|---|---|---|---|
| 2001/0026400 A1 | 10/2001 | Yoshikawa | |
| 2004/0075919 A1* | 4/2004 | Diaz ...................... | G02B 26/06 359/837 |
| 2005/0206871 A1* | 9/2005 | Tsuji ....................... | G03F 7/701 355/71 |
| 2009/0080048 A1* | 3/2009 | Tsao ....................... | G02B 7/102 359/211.1 |

FOREIGN PATENT DOCUMENTS

| | | |
|---|---|---|
| CN | 203287600 U | 11/2013 |
| CN | 103488062 A | 1/2014 |
| CN | 203535534 U | 4/2014 |
| CN | 204179915 U | 2/2015 |
| CN | 104806864 A | 7/2015 |
| CN | 105445929 A | 3/2016 |
| CN | 205436249 U | 8/2016 |
| CN | 104880913 B | 6/2017 |
| JP | H-0378723 A | 4/1991 |
| JP | 2002333574 A | 11/2002 |
| JP | 2006337611 A | 12/2006 |
| JP | 3933881 B2 | 6/2007 |
| JP | 2008103604 A | 5/2008 |
| JP | 2013174737 A | 9/2013 |
| JP | 2016030873 A | 3/2016 |
| TW | I437372 B | 5/2014 |

\* cited by examiner

OPTICAL PATH COMPENSATION DEVICE

TECHNICAL FIELD

The present invention relates to the technical field of fabrication apparatus for semiconductor integrated circuits and, more specifically, to an optical path compensation apparatus.

BACKGROUND

Light paths in measurement systems for focusing and leveling employ bi-telecentric Scheimpflug structure (for forming an inclined image of an incline object). During the establishment of such a light path, if there is a defocus error in the object plane or image plane, a tilt of a wafer surface being measured will cause a vertical measurement error, called a "defocus-tilt effect". For this reason, object/image-plane defocus shall be controlled in establishment of light path in order to reduce such a defocus-tilt effect.

Usually, optical path compensation can be accomplished by directly adjusting the position of the object plane or adding a flat plate with a certain thickness. In practice, these two approaches are associated with the following deficiencies:

1) Because the object plane serves as a reference for the measurement system for focusing and leveling, any adjustment in the position of the object plane for optical path compensation is not decoupled from changes in other directions and tends to cause errors in these directions.

2) Since there are more than 100 types of flat plates available, when a significant amount of adjustment with a high resolution is desired, choosing a flat plate with the most suitable thickness from the existing ones is a time-consuming challenge that is detrimental to productive efficiency.

SUMMARY OF THE DISCLOSURE

In order to overcome the above-discussed problems, the present invention provides an optical path compensation apparatus capable of achieving effective position correction of a focal plane of a measurement system for focusing and leveling in a smooth, convenient and precise way while not causing any error in other directions.

To this end, the technical solutions of the present invention are provided as follows:

An optical path compensation apparatus, comprising a wedge assembly, a driving mechanism and a preload unit, the wedge assembly comprising a movable wedge and a fixed wedge, the movable wedge and the fixed wedge having equal wedge angles and opposite orientations of wedge surfaces, the preload unit configured to elastically press the movable wedge on the fixed wedge, the driving mechanism configured to cause a relative movement between the wedge surface of the movable wedge and the wedge surface of the fixed wedge.

Optionally, the fixed wedge is mounted on a fixed holder, wherein the movable wedge is fixed in the fixed holder through a movable holder, wherein the fixed holder, at an inner side thereof, has a guide surface corresponding to the movable holder, and wherein the movable holder has an outer lateral surface fitting the guide surface of the fixed holder.

Optionally, the preload unit comprises a top preload module that is in a linear contact with the movable holder, the top preload module being configured, for movement of the movable wedge, to provide a preload force perpendicular to the wedge surface of the movable wedge.

Optionally, the top preload module comprises a wedge-shaped pressing block and an elastic member, the wedge-shaped pressing block having a wedge angle same as the wedge angle of the movable wedge, and a wedge surface with a same orientation as the wedge surface of the movable wedge has, the wedge-shaped pressing block being fixed to a lateral surface of the fixed holder along a movement direction of the movable holder, the elastic member having an end mounted on the movable holder and a further end in elastic contact with the wedge surface of the wedge-shaped pressing block.

Optionally, the top preload module comprises a wedge-shaped pressing block and an elastic member, the wedge-shaped pressing block having a wedge angle same as the wedge angle of the movable wedge, and a wedge surface with a same orientation as the wedge surface of the movable wedge has, wherein the movable holder has a shape of a wedge having a wedge angle same as the wedge angle of the fixed wedge and a wedge surface with a same orientation as the wedge surface of the fixed wedge has, wherein the wedge-shaped pressing block is fixed to a later surface of the fixed holder along a movement direction of the movable holder, and wherein the elastic member has an end mounted on the movable holder and a further end in elastic contact with the wedge surface of the wedge-shaped pressing block.

Optionally, the elastic member comprises a spherical shaft, a compression spring and a collar, wherein an end of the spherical shaft provided with a step serves as an elastic contacting end, and a further end for fixing and mounting serves as a thrust end, the thrust end of the spherical shaft being constrained by the collar at a mounting position, the collar and the spherical shaft being elastically fixed, the compression spring sleeving over the spherical shaft and being compressed through two ends respectively contacting with the step of the spherical shaft and the mounting position.

Optionally, the preload unit further comprises a lateral preload module mounted on the fixed holder so as to provide the movable holder with a lateral preload force.

Optionally, the lateral preload module is implemented as a set screw going through a lateral surface of the fixed holder and abutting against the outer lateral surface of the movable holder.

Optionally, the driving mechanism comprises a mounting base, a micrometer knob and tension springs, the micrometer knob being mounted to the mounting base, each of the tension springs having one end fixed to the mounting base and a further end connected to the movable wedge, the micrometer knob being able to extend or retract in a movement direction of the movable wedge, to provide a driving force for movement of the movable wedge.

Optionally, the driving mechanism comprises a mounting seat, a mounting cover, a motor assembly and a motion module, the mounting seat being provided with guide rails matching with the mounting cover, the motion module being mounted on the mounting seat and connected to the mounting cover, the mounting cover being connected to the movable wedge, the motor assembly being configured to drive the motion module to move horizontally to cause the mounting cover to move horizontally along the guide rails.

Optionally, the motion module comprises a lead screw, a lead screw support, a lead screw adapter, a bearing and a coupler, the lead screw being mounted by the lead screw support on the mounting seat, the lead screw having one end mounted with the bearing and coupler and connected to the motor assembly sequentially, and a further end fixedly connected to an inner surface of the mounting cover by virtue of the lead screw adapter.

Optionally, the mounting cover is provided thereon with a push rod and a tension spring, the tension spring being connected to the movable wedge, the push rod being oriented in a movement direction of the movable wedge and configured to drive the movable wedge under an action of the motor module.

Optionally, the driving mechanism further comprises a limiter comprising triggers, a limiting block and connecting blocks, the limiting block being fixed to the mounting cover, the triggers being fixed by the respective connecting blocks to the mounting seat at two opposite sides of the mounting seat with respect to the limiting block, the limiting block extending downward into positional correspondence with the triggers.

Optionally, the driving mechanism further comprises a linear encoder, a linear encoder reading head and a reading head holder, the linear encoder being mounted on an outer surface of the mounting cover, the reading head holder being fixed to the mounting seat, the linear encoder reading head being mounted on the linear encoder by the reading head holder.

In the optical path compensation apparatus of the present invention, the wedge assembly is added in the vicinity of an object plane or image plane, and the wedge surface of the movable wedge can be driven by the driving mechanism to move horizontally with respective to the fixed wedge, resulting in a gradual change in the thickness of the wedge assembly, and hence the optical path can be adjusted accordingly. In this way, effective position correction of a focal plane of a measurement system for focusing and leveling can be achieved while not causing any error in other directions. Moreover, the preload unit can provide constant preloads, which ensures stable and smooth movement of the movable wedge, thereby allowing convenient operation and high correction accuracy.

BRIEF DESCRIPTION OF THE DRAWINGS

In FIGS. 1 to 18, 100 denotes a wedge assembly; 110 denotes a fixed wedge; 120 denotes a movable wedge; 130 denotes a fixed holder; 140 denotes a movable holder; 141 denotes a guide surface; 150 denotes a wedge-shaped movable holder; 200 denotes a driving mechanism; 210 denotes a mounting seat; 211 denotes a guide rail; 220 denotes a mounting cover; 221 denotes a push rod; 222 denotes a first tension spring; 230 denotes a motor assembly; 231 denotes a motor; 232 denotes a motor support; 240 denotes a motion module; 241 denotes a lead screw; 242 denotes a lead screw support; 243 denotes a bearing; 244 denotes a coupler; 245 denotes a lead screw adapter; 250 denotes a linear encoder; 260 denotes a linear encoder reading head; 270 denotes a reading head holder; 281 denotes a micrometer knob; 282 denotes a second tension spring; 283 denotes a mounting base; 284 denotes a microdrum; 300 denotes a top preload module; 310 denotes a first wedge-shaped pressing block; 320 denotes an elastic member; 321 denotes a spherical shaft; 322 denotes a compression spring; 323 denotes a collar; 330 denotes a second wedge-shaped pressing block; 400 denotes a lateral preload block; 500 denotes a limiter; 510 denotes a trigger; 520 denotes a limiting block; and 530 denotes a connecting block.

DETAILED DESCRIPTION

The above objects, features and advantages of the present invention will become more apparent upon reading the following detailed description of a few specific embodiments in conjunction with the accompanying drawings. It is noted that the drawings are provided in a very simplified form not necessarily drawn to scale, and only intent to facilitate convenience and clarity in explaining the embodiments.

Embodiment 1

According to the present invention, the optical path compensation apparatus is deployed in a focusing and leveling system in order to alter the length of an optical path during the assembly and commissioning of a photolithography tool and feed information about the alteration of the optical path back to the focusing and leveling system, thereby correcting the position of a focal plane. It is noted that deployment of the optical path compensation apparatus in a focusing and leveling system is merely one of the embodiments of the present invention, which are not limited thereto.

As shown in FIGS. 1 to 4, the optical path compensation apparatus includes a wedge assembly 100, a driving mechanism 200 and a preload unit. The wedge assembly 100 includes a movable wedge 120 and a fixed wedge 110. The movable wedge 120 and the fixed wedge 110 have equal wedge angles as well as respective wedge surfaces inclined in opposite directions. The preload unit is configured to elastically press the movable wedge 120 on the fixed wedge 110, while the driving mechanism 200 is configured to cause relative movement between the wedge surfaces of the movable wedge 120 and the fixed wedge 110. The movable wedge 120 and the fixed wedge 110 are both made from light-transmissive materials, and the wedge assembly 100 is disposed in a light path of the focusing and leveling system. A length of the optical path can be changed by altering a thickness of the wedge assembly 100 through changing a relative positional relationship between the movable wedge 120 and the fixed wedge 110.

Figure 1:
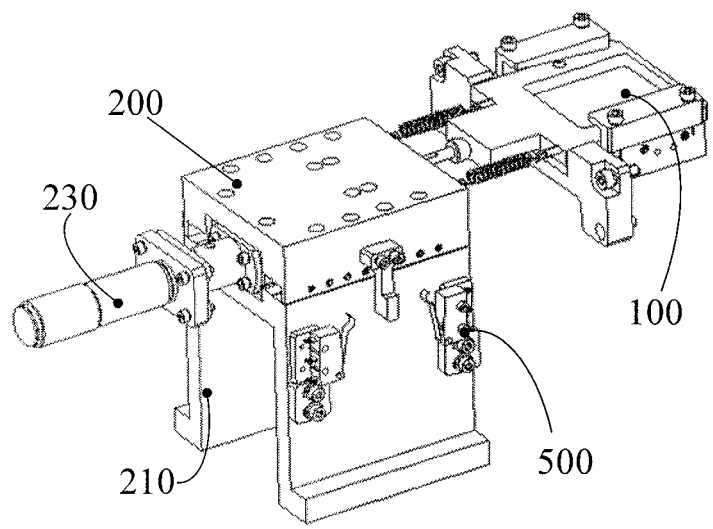
FIG. 1 is a schematic structural diagram of an optical path compensation apparatus according to a first embodiment of the present invention.
Figure 2:
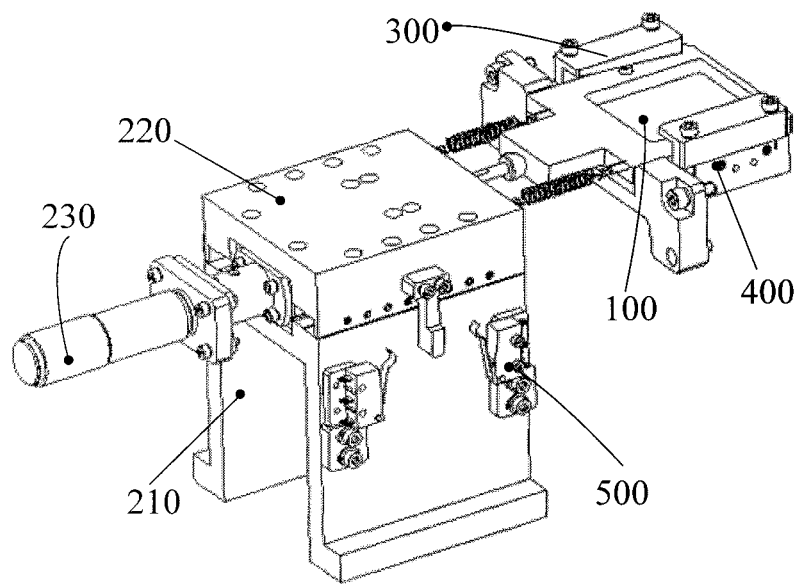
FIG. 2 is a schematic structural diagram of an optical path compensation apparatus according to the first embodiment of the present invention.
Figure 3:
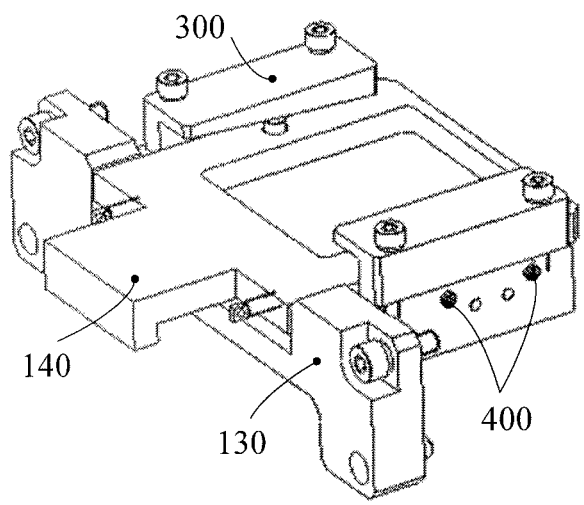
FIG. 3 is a schematic structural diagram of a wedge assembly according to the first embodiment of the present invention.
Figure 4:
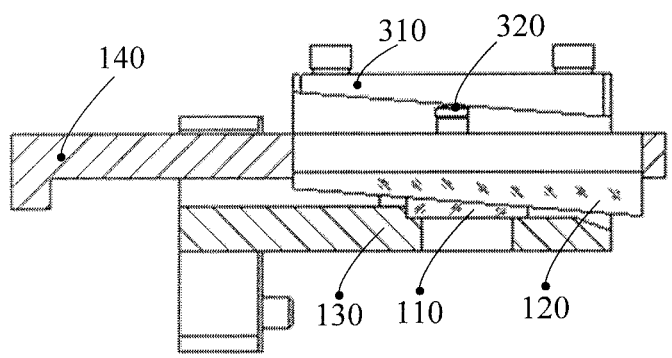
FIG. 4 is a section view of the wedge assembly according to the first embodiment of the present invention.
Figure 5:
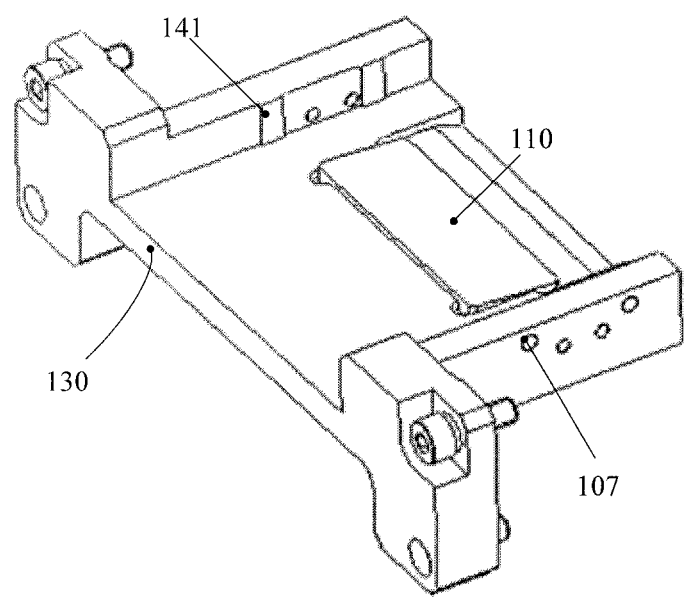
FIG. 5 is a schematic structural diagram of a fixed holder according to the first embodiment of the present invention.
Figure 6:
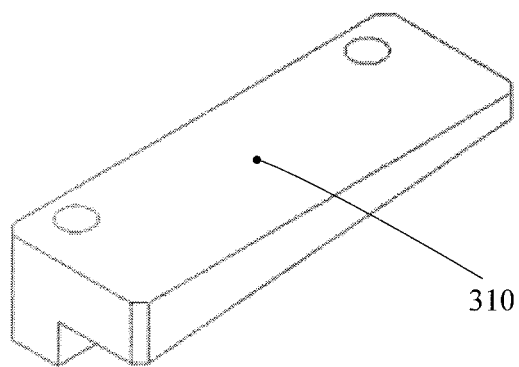
FIG. 6 is a schematic structural diagram of a wedge-shaped pressing block according to the first embodiment of the present invention.

Additionally, as shown in FIGS. 3 to 5, the fixed wedge 110 may be mounted on a fixed holder 130, while the movable wedge 120 may be fixed to a movable holder 140 in the fixed holder 130. The fixed holder 130 may, at inner sides thereof, have guide surfaces 141 for cooperating with the movable holder 140, while the movable holder 140 may have outer lateral surfaces contacting with the guide surfaces 141 of the fixed holder 130 completely. In this embodiment, the fixed holder 130 preferably has, at inner sides thereof, two guide surfaces 141 for guiding the movable holder 140 to move within the fixed holder 130.

Additionally, as shown in FIGS. 3 to 6, the preload unit may include top preload modules 300 that are each in a linear contact with the movable holder 140. The top preload modules 300 provide preload forces perpendicular to the wedge surface of the movable wedge 120, for movement of the movable wedge 120. Further, the top preload modules 300 may each include a first wedge-shaped pressing block 310 and an elastic member 320. The first wedge-shaped pressing block 310 may have the same wedge angle and wedge surface orientation as the movable wedge 120. The first wedge-shaped pressing block 310 may be fixed on a lateral surface of the fixed holder 130 along the direction in which the movable holder 140 is moveable. The elastic member 320 may be mounted on the movable holder 140 at one end and brought into elastic contact with the wedge surface of the first wedge-shaped pressing block 310.

Figure 7:
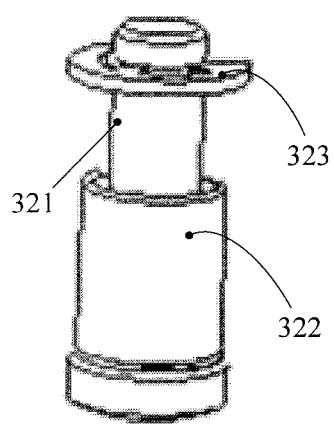
FIG. 7 is a schematic structural diagram of an elastic member according to the first embodiment of the present invention.

Additionally, as shown in FIGS. 4 and 7, the elastic member 320 may include a spherical shaft 321, a compression spring 322 and a collar 323. The spherical shaft 321 may have an elastic contacting end provided with a step, and a thrust end for mounting and fixing. The thrust end of the spherical shaft 321 may be constrained by the collar 323 at a mounting location. In this embodiment, the thrust end portion may be constrained by the collar 323 on the movable holder 140. The collar 323 and the spherical shaft 321 are elastically fixed. The compression spring 322 may sleeve over the spherical shaft 321, and with its two ends coming into contact respectively with the step of the spherical shaft 321 and the movable holder 140, the compression spring 322 is compressed. The step of the spherical shaft 321 may abut against the wedge surface of the first wedge-shaped pressing block 310.

Preferably, with continued reference to FIG. 3, the preload unit may further include lateral preload modules 400 mounted on two sides of the fixed holder 130 so as to provide the movable holder 140 with lateral preload forces. According to this embodiment, the lateral preload modules 400 are preferably implemented as set screws, which go through lateral surfaces of the fixed holder 130 and abut against lateral surfaces of the movable holder 140.

Figure 8:
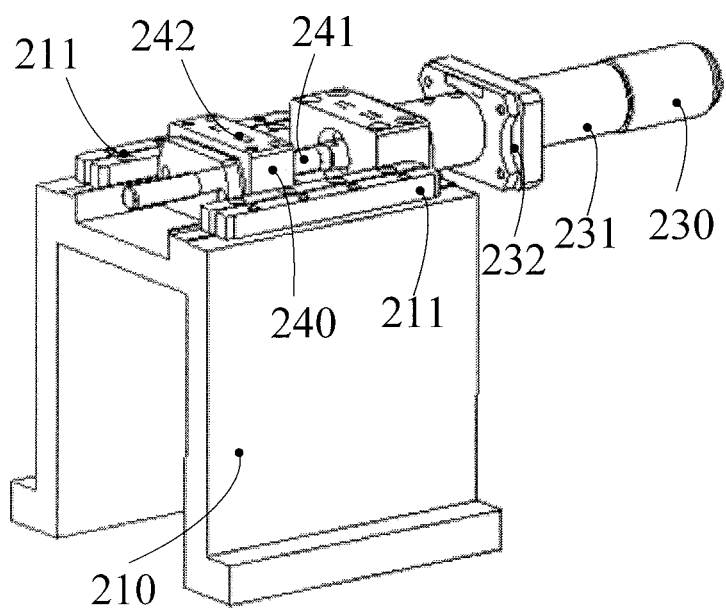
FIG. 8 is a schematic structural diagram of a driving mechanism according to the first embodiment of the present invention.
Figure 9:
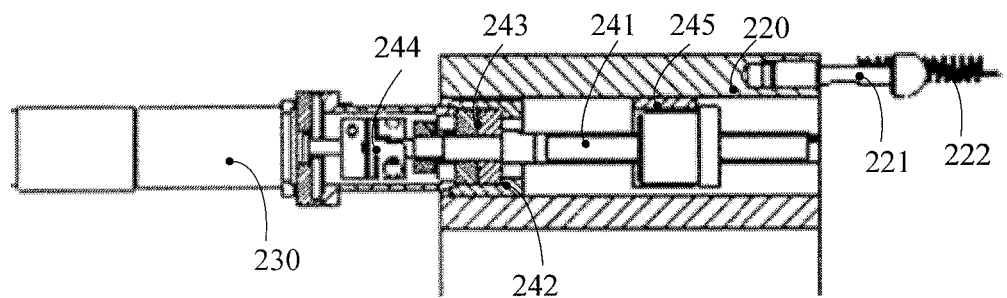
FIG. 9 is a sectional view of the driving mechanism according to the first embodiment of the present invention.

Additionally, as shown in FIGS. 8 to 9, the driving mechanism 200 may include a mounting seat 210, a mounting cover 220, a motor assembly 230 and a motion module 240. The mounting seat 210 is provided with guide rails 211 that can mate with the mounting cover 220. The motion module 240 may be mounted on the mounting seat 210 and coupled to the mounting cover 220, and the mounting cover 220 may be connected to the movable wedge 120. The motor assembly 230 may be configured to drive the motion module 240 to move horizontally, thereby causing the mounting cover 220 to move horizontally along the guide rails 211.

Additionally, with continued reference to FIG. 8, the motor assembly 230 may include a motor support 232 and a motor 231 coupled by the motor support 232 to the motion module 240.

Additionally, with continued reference to FIG. 9, the motion module 240 may include a lead screw 241, a lead screw support 242, a lead screw adapter 245, a bearing 243 and a coupler 244. The lead screw 241 may be mounted by the lead screw support 242 on the mounting seat 210 so that one end of the lead screw 241 is sequentially mounted with the bearing 243 and coupler 244 and then connected to the motor assembly 230, while the other end of the lead screw 241 is fixedly connected to an inner surface of the mounting cover 220 by virtue of the lead screw adapter 245. With the aid of the bearing 243 and coupler 244, the rotational movement of the motor assembly 230 can be converted to translational movement of the lead screw 241, which will cause the mounting cover 220 to translate along the guide rails 211.

Additionally, with continued reference to FIG. 9, the mounting cover 220 may be provided thereon with a push rod 221 and a first tension spring 222. The first tension spring 222 may be connected to the movable wedge 120, while the push rod 221 may be oriented along the movement direction of the movable wedge 120 and configured to push the movable wedge 120 under the action of the motor assembly 230.

Figure 10:
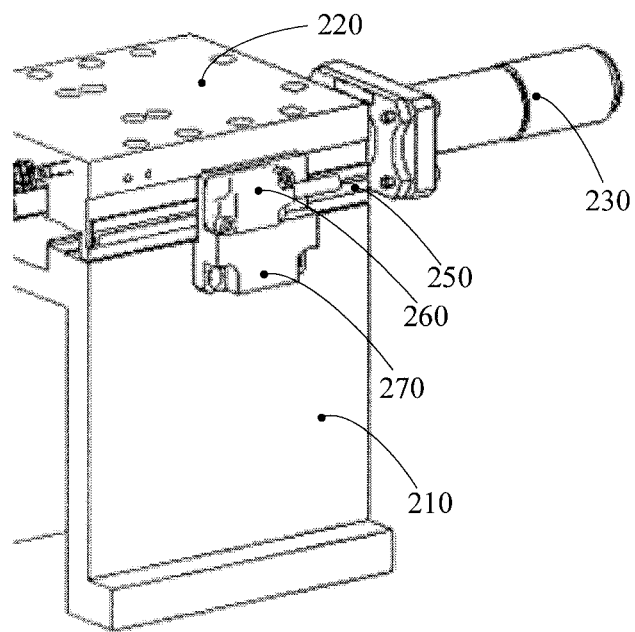
FIG. 10 is a schematic structural diagram of a linear encoder according to the first embodiment of the present invention.

Preferably, as shown in FIG. 10, the driving mechanism 200 may include a linear encoder 250, a linear encoder reading head 260 and a reading head holder 270. The linear encoder 250 may be mounted on an outer surface of the mounting cover 220, while the reading head holder 270 may be fixed to the mounting seat 210, and the linear encoder reading head 260 is arranged on the linear encoder 250 by the reading head holder 270. When the mounting cover 220 is translating, the linear encoder 250 will move with the mounting cover 220, concurrently with the linear encoder reading head 260 obtaining information about displacement of the movable wedge 120 and feeding the information back to the focusing and leveling system, from which, displacement of the focal plane of the focusing and leveling system can be deduced.

Figure 11:
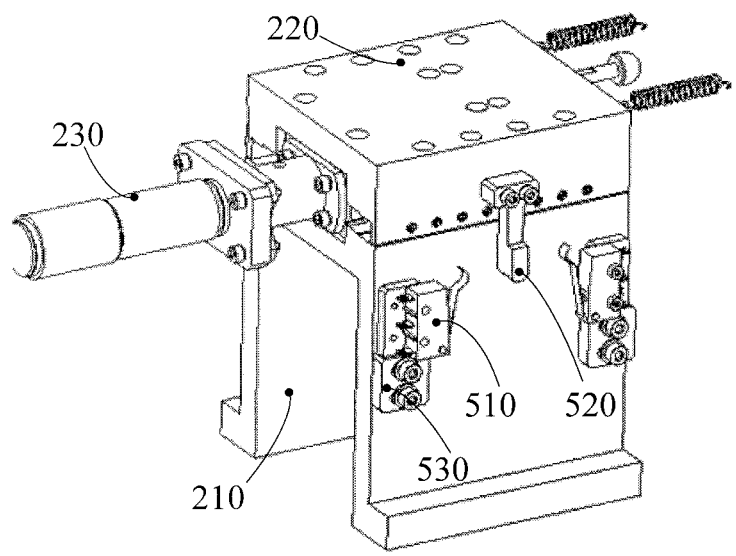
FIG. 11 is a schematic structural diagram of a limiter according to the first embodiment of the present invention.

Additionally, as shown in FIG. 11, the driving mechanism 200 may further include a limiter 500 including triggers 510, a limiting block 520 and connecting blocks 530. The limiting block 520 may be fixed to the mounting cover 220, while the triggers 510 may be fixed by the respective connecting blocks 530 at two opposite sides of the mounting seat 210 with respect to the limiting block 520. The limiting block 520 may extend downward into positional correspondence with the triggers 510. With this design, the limiting block 520 will move with the mounting cover 220, and upon the extension portion of the limiting block 520 coming into contact with any of the triggers 510, an alarm may be raised to avoid damage.

Operations of the optical path compensation apparatus of the present invention will be described below with reference to FIGS. 1 to 10.

The motor 231 may be activated so that the lead screw 241 translates under the drive of the motor 231, causing the mounting cover 220 to linearly move along the guide rails 211 and then the first tension spring 222 is forced to linearly move accordingly. Pulled by the first tension spring 222, the movable holder 140 will translate along the guide surfaces 141 with high stability ensured by both the push rod 221 and first tension spring 222. The moving movable holder 140 will drive the movable wedge 120 to slide over the wedge surface of the fixed wedge 110, and constant preload forces may be provided by the top preload modules 300 and the lateral preload modules 400 during the movement of the movable holder 140, which ensures a stable and smooth movement of the movable holder 140. At the same time, the limiter 500 will prevent the lead screw 241 from moving out of the limits.

Figure 12:
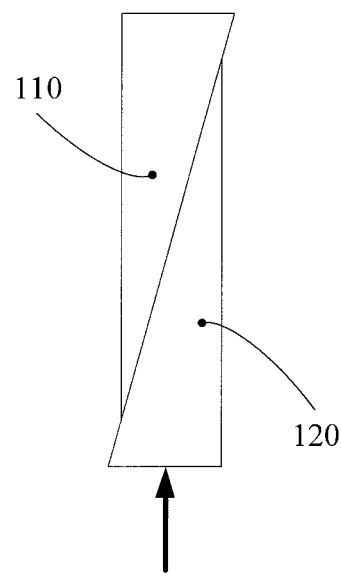
FIG. 12 is a diagram schematically illustrating a relative positional relationship between components in the wedge assembly according to the first embodiment of the present invention.
Figure 13:
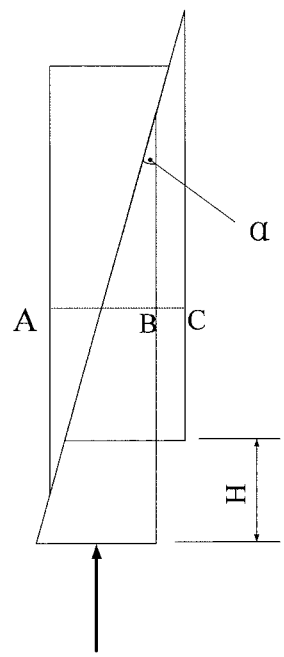
FIG. 13 is a diagram schematically illustrates a movement of the movable wedge in accordance with the first embodiment of the present invention.
Figure 14:
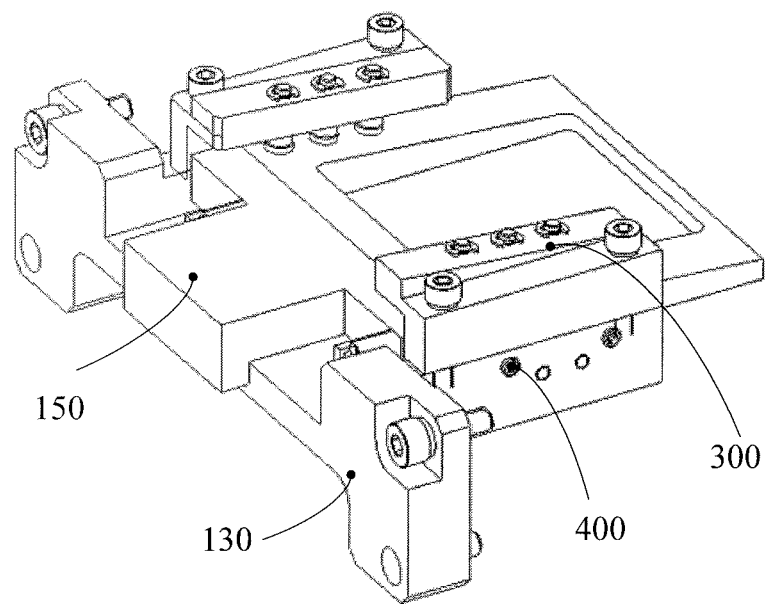
FIG. 14 is a schematic structural diagram of a wedge assembly according to a second embodiment of the present invention.
Figure 15:
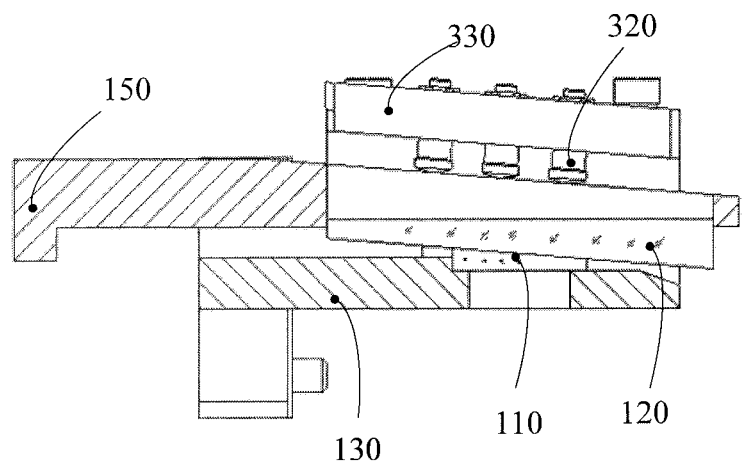
FIG. 15 is a sectional view of the wedge assembly according to the second embodiment of the present invention.
Figure 16:
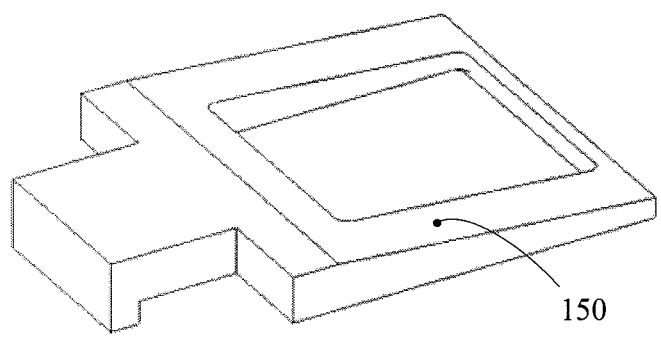
FIG. 16 is a schematic structural diagram of a movable holder according to the second embodiment of the present invention.
Figure 17:
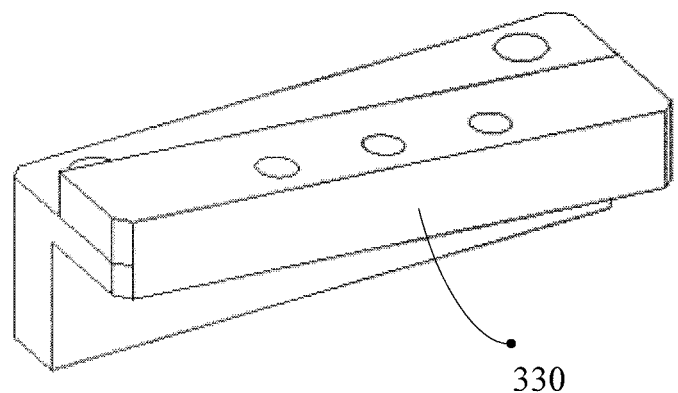
FIG. 17 is a schematic structural diagram of a wedge-shaped pressing block according to the second embodiment of the present invention.

As shown in FIGS. 12 to 13, the movement of the movable wedge 120 may result in a change in the thickness of the wedge assembly 100 from AC to AB, i.e., a change by BC, and hence a variation in the optical path. The displacement of the movable wedge 120 measured by the linear encoder reading head 260 is indicated as H, the variation in the optical path will be H $\tan(\alpha)(n-1)/n$, where $\alpha$ represents the wedge angle of the movable wedge 120, and n represents the refractive index of the movable wedge 120. When the optical path is tuned to align the image plane with a focal plane of the detector, the movable wedge 120 may not be moved any more. Otherwise, the movable wedge 120 may continue moving.

Table 1 presents a relationship between driving forces and friction forces during relative sliding movement between the movable wedge 120 and the fixed wedge 110, which is defined by the formula: F $COS(\beta) F \geq fu$ (mg+$F_1$), according to the present invention. The driving forces are applied in the movement direction of the movable wedge 120, and in the formula, $\beta$ represents an angle between the driving force and the movement direction of the movable wedge 120; F represents the driving force; f represents the friction force exerted on the movable wedge 120 during the relative movement; mg represents the gravity, which is 1.5 N according to this embodiment; $F_1$ represents a preload force provided by the preload unit, in which according to this embodiment, each compression spring 322 is preferred to have an outer diameter of ϕ4, a free length of 15 mm, a maximum allowable displacement of 5.25 mm, a wire diameter of ϕ0.55 mm and a spring constant of 2.0 N/mm and to be compressed by 3 mm to generate a force of 2.0×3=6 N; and u represents the coefficient of friction, wherein, in this embodiment, immersion oil can be applied between the movable wedge 120 and the fixed wedge 110 so that the coefficient of friction is 0.12 during the movement of the movable wedge 120.

TABLE 1

Data about Friction during Relative Movement in Wedge Assembly

| Wedge Displacement (mm) | 3 | 6 | 9 | 15 |
|---|---|---|---|---|
| Preload (N) | 12 | 12 | 12 | 12 |
| Gravity (N) | 1.5 | 1.5 | 1.5 | 1.5 |
| Friction during Movement (N) | 1.62 | 1.62 | 1.62 | 1.62 |

Embodiment 2

This embodiment differs from Embodiment 1 in that the movable holder 150 according to this embodiment is wedge-shaped and provided, during its movement, with preload forces by the top preload modules 300. Specifically, as shown in FIGS. 14 to 17, each of the top preload modules 300 includes a second wedge-shaped pressing block 330 and an elastic member 320. The second wedge-shaped pressing block 330 has the same wedge angle and wedge surface orientation as the movable wedge 120, while the wedge-shaped movable holder 150 has the same wedge angle and wedge surface orientation as the fixed wedge 110. The second wedge-shaped pressing block 330 is mounted on a lateral surface of the fixed holder 130 along a movement direction of the wedge-shaped movable holder 150, while the elastic member 320 is mount to the pressing block at one end and brought into elastic contact with the wedge surface of the wedge-shaped movable holder 150 so as to provide a preload to the movable wedge 120 during its sliding movement, wherein the preload force is perpendicular to the wedge surface of the wedge-shaped movable wedge 120, in this way, a smooth and stable sliding movement can be ensured.

Embodiment 3

Figure 18:
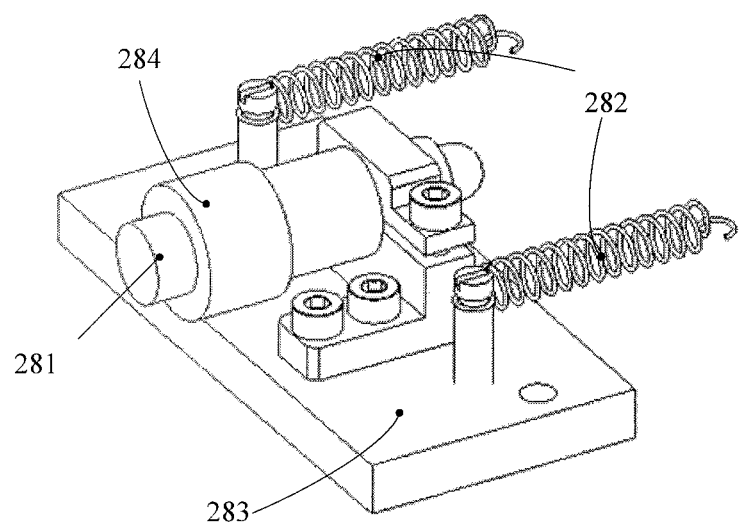
FIG. 18 is a schematic structural diagram of a driving mechanism according to a third embodiment of the present invention.

This embodiment differs from Embodiments 1 and 2 in that, as shown in FIG. 18, the driving mechanism 200 includes a mounting base 283, a micrometer knob 281 and second tension springs 282 in accordance with this embodiment. The micrometer knob 281 is mounted to the mounting base 283, and each of the second tension springs 282 is fixed to the mounting base 283 at one end and coupled to the movable wedge 120 at the other end. The micrometer knob 281 is able to extend or retract in the movement direction of the movable wedge 120 and thereby provide a driving force to the movable wedge 120. A microdrum 284 may be additionally provided, on which a scale is marked in order to indicate information about displacement of the movable wedge 120.

Apparently, those skilled in the art can make various modifications and variations to the present invention without departing from the spirit and scope thereof. Accordingly, the invention is intended to embrace all such modifications and variations if they fall within the scope of the appended claims and equivalents thereof.

What is claimed is:

1. An optical path compensation apparatus, comprising a wedge assembly, a driving mechanism and a preload unit, the wedge assembly comprising a movable wedge and a fixed wedge, the movable wedge and the fixed wedge having equal wedge angles and opposite orientations of wedge surfaces, the fixed wedge being mounted on a fixed holder, wherein the movable wedge is fixed in the fixed holder through a movable holder, wherein the fixed holder, at an inner side thereof, has a guide surface corresponding to the movable holder, and wherein the movable holder has an outer lateral surface fitting the guide surface of the fixed holder, the preload unit comprising a top preload module that is in a linear contact with the movable holder, the top preload module being configured, for movement of the movable wedge, to provide a preload force perpendicular to the wedge surface of the movable wedge, the driving mechanism configured to cause a relative movement between the wedge surface of the movable wedge and the wedge surface of the fixed wedge;

wherein the top preload module comprises a wedge-shaped pressing block and an elastic member, the wedge-shaped pressing block having a wedge angle same as the wedge angle of the movable wedge, and a wedge surface with a same orientation as the wedge surface of the movable wedge has, the wedge-shaped pressing block being fixed to a lateral surface of the fixed holder along a movement direction of the movable holder, the elastic member having an end mounted on the movable holder and a further end in elastic contact with the wedge surface of the wedge-shaped pressing block.

2. The optical path compensation apparatus of claim 1, wherein the movable holder has a shape of a wedge having a wedge angle same as the wedge angle of the fixed wedge and a wedge surface with a same orientation as the wedge surface of the fixed wedge has.

3. The optical path compensation apparatus of claim 1, wherein the elastic member comprises a spherical shaft, a compression spring and a collar, wherein an end of the spherical shaft provided with a step serves as an elastic contacting end, and a further end for fixing and mounting serves as a thrust end, the thrust end of the spherical shaft being constrained by the collar at a mounting position, the collar and the spherical shaft being elastically fixed, the compression spring sleeving over the spherical shaft and being compressed through two ends respectively contacting with the step of the spherical shaft and the mounting position.

4. The optical path compensation apparatus of claim 1, wherein the preload unit further comprises a lateral preload module mounted on the fixed holder so as to provide the movable holder with a lateral preload force.

5. The optical path compensation apparatus of claim 4, wherein the lateral preload module is implemented as a set screw going through a lateral surface of the fixed holder and abutting against the outer lateral surface of the movable holder.

6. The optical path compensation apparatus of claim 1, wherein the driving mechanism comprises a mounting base, a micrometer knob and tension springs, the micrometer knob being mounted to the mounting base, each of the tension springs having one end fixed to the mounting base and a further end connected to the movable wedge, the micrometer knob being able to extend or retract in a movement direction of the movable wedge, to provide a driving force for movement of the movable wedge.

7. The optical path compensation apparatus of claim 1, wherein the driving mechanism comprises a mounting seat, a mounting cover, a motor assembly and a motion module, the mounting seat being provided with guide rails matching with the mounting cover, the motion module being mounted on the mounting seat and connected to the mounting cover, the mounting cover being connected to the movable wedge, the motor assembly being configured to drive the motion module to move horizontally to cause the mounting cover to move horizontally along the guide rails.

8. The optical path compensation apparatus of claim 7, wherein the motion module comprises a lead screw, a lead screw support, a lead screw adapter, a bearing and a coupler, the lead screw being mounted by the lead screw support on the mounting seat, the lead screw having one end mounted with the bearing and coupler and connected to the motor assembly sequentially, and a further end fixedly connected to an inner surface of the mounting cover by virtue of the lead screw adapter.

9. The optical path compensation apparatus of claim 7, wherein the mounting cover is provided thereon with a push rod and a tension spring, the tension spring being connected to the movable wedge, the push rod being oriented in a movement direction of the movable wedge and configured to drive the movable wedge under an action of the motor module.

10. The optical path compensation apparatus of claim 7, wherein the driving mechanism further comprises a limiter comprising triggers, a limiting block and connecting blocks, the limiting block being fixed to the mounting cover, the triggers being fixed by the respective connecting blocks to the mounting seat at two opposite sides of the mounting seat with respect to the limiting block, the limiting block extending downward into positional correspondence with the triggers.

11. The optical path compensation apparatus of claim 7, wherein the driving mechanism further comprises a linear encoder, a linear encoder reading head and a reading head holder, the linear encoder being mounted on an outer surface of the mounting cover, the reading head holder being fixed to the mounting seat, the linear encoder reading head being mounted on the linear encoder by the reading head holder.

12. The optical path compensation apparatus of claim 2, wherein the elastic member comprises a spherical shaft, a compression spring and a collar, wherein an end of the spherical shaft provided with a step serves as an elastic contacting end, and a further end for fixing and mounting serves as a thrust end, the thrust end of the spherical shaft being constrained by the collar at a mounting position, the collar and the spherical shaft being elastically fixed, the compression spring sleeving over the spherical shaft and being compressed through two ends respectively contacting with the step of the spherical shaft and the mounting position.

\* \* \* \* \*